United States Patent [19]

Kitagawa et al.

[11] Patent Number: 5,204,283
[45] Date of Patent: Apr. 20, 1993

[54] METHOD OF GROWTH II-VI SEMICONDUCTING COMPOUNDS

[75] Inventors: Masahiko Kitagawa; Yoshitaka Tomomura, both of Nara, Japan

[73] Assignee: Sharp Kabushiki Kaisha, Osaka, Japan

[21] Appl. No.: 750,432

[22] Filed: Aug. 20, 1991

Related U.S. Application Data

[63] Continuation of Ser. No. 423,486, Oct. 12, 1989, abandoned, which is a continuation of Ser. No. 183,407, Apr. 15, 1988, abandoned, which is a continuation-in-part of Ser. No. 130,948, Dec. 10, 1987, abandoned.

[30] Foreign Application Priority Data

Dec. 12, 1986 [JP]  Japan ................................ 61-297025

[51] Int. Cl.$^5$ .......................................... H01L 21/205
[52] U.S. Cl. .................................... 437/105; 156/606;
156/612; 156/DIG. 72; 156/DIG. 77;
148/DIG. 64
[58] Field of Search ....... 156/606, 610, 612, DIG. 72,
156/DIG. 77; 148/DIG. 64; 437/105

[56] References Cited

U.S. PATENT DOCUMENTS 4,509,997  4/1985  Cockayne et al. .................... 156/612
4,735,910  4/1988  Mitsuya et al. ..................... 437/105

FOREIGN PATENT DOCUMENTS 47-12058    4/1972  Japan ................................. 156/610
59-146999   8/1984  Japan ................................. 437/105
61-297686  11/1986  Japan ................................. 156/610

OTHER PUBLICATIONS

Hartmann, "Studies on the vapor growth of ZnS, ZnSe and ZnTe single crystals", Journal of crystal growth 42 (1977) 144–149.
Fujita et al., "Growth of cubic ZnS, ZnSe and $ZnS_xSe_{1-x}$ single crystals by iodine transport," Journal of crystal growth 47 (1979) 326–334.
Palosz, "Growth of ZnS and $Zn_{1-x}Cd_xS$ ($x \leq 0.07$) Single crystals by iodine transport", Journal of crystal growth 60 (1982) 57–66.
John et al., "optically driven vapor transport of solids," IBM Tech. Disc. Bull. vol. 5, No. 5, Oct. 1962, 5–6.
Parker, "Single crystals and epitaxial films of ZnSe by chemical transport", J. Cryst. growth 9 (1971) 177–182.
Lendvay et al., "Hollow single crystal, of ZnS", J. Cryst. growth, 7 (1970) 61–64.

Primary Examiner—Olik Chaudhuri
Assistant Examiner—Ourmazd S. Ojan
Attorney, Agent, or Firm—Karl Bozicevic

[57] ABSTRACT

A high-purity II-VI semiconducting compound can be produced by initially preparing a substrate of a II-VI semiconducting compound by a chemical transport method with a halogen as transport medium and then epitaxially growing a layer of a II-VI compound on this substrate.

4 Claims, 2 Drawing Sheets

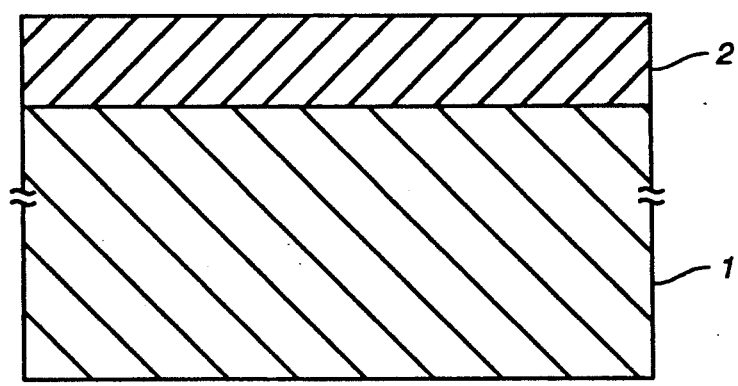
FIG._1
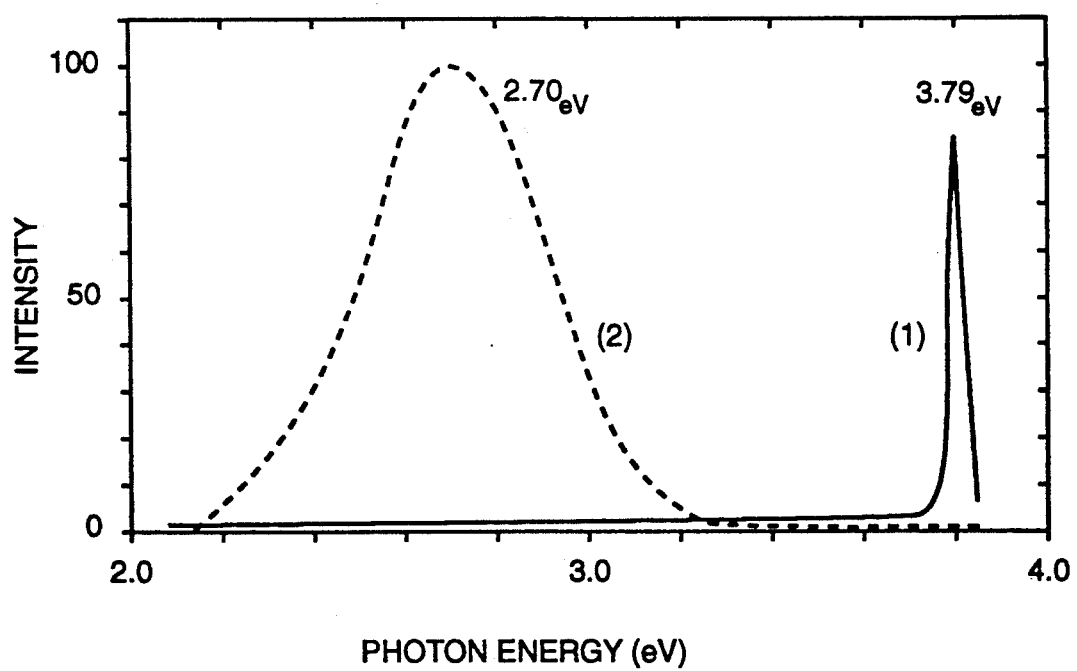
FIG._2

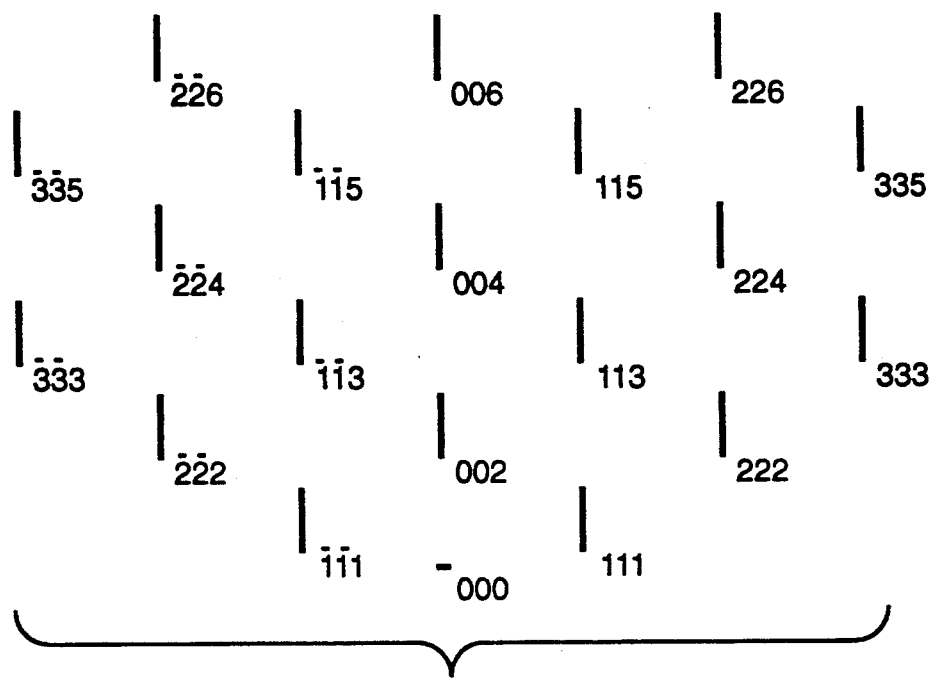
FIG._3A
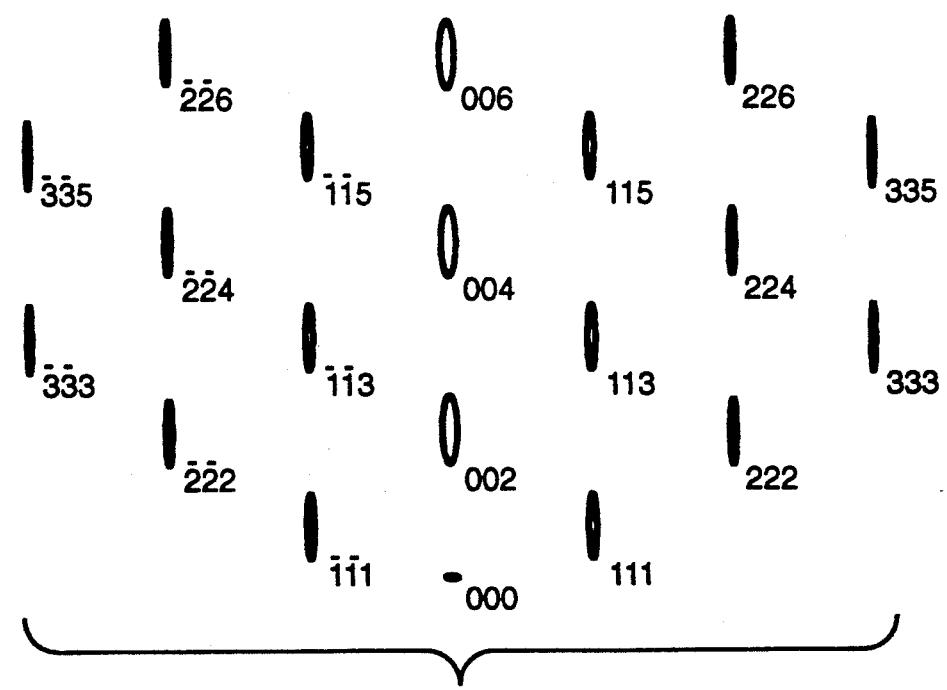
FIG._3B

METHOD OF GROWTH II-VI SEMICONDUCTING COMPOUNDS

CROSS REFERENCES

This application is a continuation of earlier filed U.S. application Ser. No. 07/423,486, filed Oct. 12, 1989, now abandoned, which application is a continuation of earlier filed U.S. application Ser. No. 07/183,407, filed Apr. 15, 1988 (abandoned), which application is a continuation-in-part of earlier filed U.S. application Ser. No. 07/130,948, filed Dec. 10, 1987 (abandoned), which applications are incorporated herein by reference and to which applications we claim priority under 35 USC §120 and is based on Japanese application 61-297025, filed Dec. 12, 1986, which application is incorporated herein by reference and to which application we claim priority under 35 USC §119.

BACKGROUND OF THE INVENTION

This invention relates to a method of epitaxially growing II-VI semiconducting compounds such as ZnS, ZnSe and ZnTe as well as solid solutions and superlattice crystals comprised thereof.

Having a wide gap of the direct transition type, II-VI semiconducting compounds such as ZnS, ZnSe and ZnTe can emit ultraviolet, blue and green light with high efficiency. Since there is yet to be developed a technology of growing crystals capable of controlling both the p and n conductive types, however, the fields of their application as industrially acceptable semiconducting elements are extremely limited. Among these compounds, only ZnS is considered practically acceptable and used mainly as a phosphor.

Recently, there have been efforts to use the new technologies of growing thin film single crystals such as the organic metal chemical vapor deposition method and the molecular beam epitaxy method to realize an injection-type high-efficiency light emitting element in the range between short-wavelength visible and ultraviolet which cannot be realized with other compounds. The new growth technologies such as the organic metal chemical vapor deposition method and the molecular beam epitaxy method are now nearly established as methods by which high-purity crystals of III-V semiconducting compounds can be controllably obtained. It is therefore desirable to establish similar technologies for II-VI semiconducting compounds. If the conventional metalorganic chemical vapor deposition (MOCVD) or molecular beam epitaxy method is used to epitaxially grow a II-VI semiconducting compound, however, a III-V semiconducting compound with a similar lattice constant, etc. is used as the substrate for the growth but there remain many problems which tend to counteract the advantages of these new growth technologies. In the heteroepitaxial growth using a substrate of GaAs or the like, for example, defects caused by a misfitting occur inevitably because the lattice constants do not match. In order to match the lattice constants, attempts may be made to add a new element to make a mixed crystal substrate or alternatively to grow a mixed crystal but it is extremely difficult to achieve a precise control with good reproducibility. Accordingly, the problem of defects caused by misfittings is extremely difficult to solve. Moreover, since the substrate and the crystal to be grown are of different types, their coefficients of thermal expansion are different and a tensile force or a compressive force inevitably acts on the crystal being grown. Defects are therefore induced as the temperature changes after the growth, for example, when the temperature is reduced or during a subsequent heat treatment. Furthermore, III-V semiconducting compounds and semiconducting elements of Group IV act materially as impurities in a II-VI semiconducting compound. Since they inevitably become mixed into the crystal during its growth, they tend to reduce the purity of the grown crystal. It now goes without saying that these problems are extremely serious obstacles to obtaining high-quality crystals with a low defect density which are necessary for the control of physical characteristics (p and n conductive-type control) of II-VI semiconducting compounds.

SUMMARY OF THE INVENTION

It is therefore an object of the present invention to eliminate the problems described above by providing a method of epitaxially growing a single crystal film of a II-VI semiconducting compound with high purity and few defects.

The above and other objects of the present invention are achieved by using as the substrate a bulk single crystal of ZnS, ZnSe or the like grown by the halogen transport method for the epitaxial growth of a II-VI semiconducting compound such as ZnS, ZnSe and ZnTe and epitaxially growing a second II-VI semiconducting compound on this already halogen-containing substrate.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 shows the layer structure of a II-VI semiconducting ZnS compound obtainable by a method embodying the present invention.

FIG. 2 is a graph showing photoluminescence of single crystalline ZnS obtained by a method embodying the present invention and a ZnS crystal grown by a prior art method, and FIGS. 3A and 3B are reflection high-energy electron diffraction patterns of ZnS crystals obtained by a method embodying the present invention and by a prior art method, respectively.

DETAILED DESCRIPTION OF THE INVENTION

The method of the present invention for epitaxially growing a single crystal film is characterized wherein a bulk single crystal grown by a chemical transport growth method with a halogen as transport medium is used as the substrate for the epitaxial growth of a II-VI semiconducting compound such as ZnS, ZnSe and ZnTe. The halogen chemical transport method makes it possible to grow a high-quality bulk single crystal of ZnS, ZnSe, etc. and has established a new technology for producing a single crystal serving as substrate.

For example, a single crystal of size about 2 cm can be easily grown with iodine as transport medium and a substrate wafer of about $1 \times 1 \times 0.05$ cm$^3$ can be obtained. The EPD of such a substrate crystal is about $10^4$ cm$^{-2}$ and it is approximately the same with substrates with III-V semiconducting compounds currently in use. Stable substrates of high resistance and low resistance can be produced from the substrates of the present invention by a heat processing or the like. Various physical characteristics necessary for an epitaxial growth as well as crystal characteristics such as substrate direction may be specified, and the same is true also with bulk single crystals obtained by the halogen transport method with bromine, chlorine or fluorine rather than iodine used as transport medium.

Such a halogen-containing substrate according to the present invention may be formed by supplying atomic halogen or halogen compound such as halide of bismuth, germanium or silver into a reactor at 0.1-2.0 atmosphere (in halogen pressure) or at a rate of 1-10 mg/cm$^3$ without using a carrier gas after the internal pressure of the reactor is reduced to $2 \times 10^{-7}$ Torr.

Although bulk single crystals of ZnS, ZnSe, etc. obtained with a halogen as transport medium contain small amounts of halogens as impurities, the density of other impurities and defects is low and the impurities other than halogens do not affect crystal characteristics. Moreover, since halogens can be mostly diffused out of the crystal by a high-temperature heat treatment, their density can be reduced and sufficiently stable substrate crystals can be obtained by this method. With iodine, the density inside the crystal is not reduced very much by a heat treatment but iodine is relatively stable within a crystal and substrates containing it therefore can usually be used directly as a stable high-quality substrate for an ordinary epitaxial growth process. Normal chemical surface treatments necessary for semiconductors can be easily carried out on a substrate produced from a bulk single crystal grown by a halogen method and a high-quality substrate for expitaxial growth can thus be obtained. Homoepitaxial growth can be achieved by epitaxially growing a II-VI semiconducting compound such as ZnS and ZnSe on such a substrate of a II-VI semiconducting compound and a high-quality single crystal can be obtained.

In what follows, the present invention is explained further by way of examples.

EXAMPLE NO. 1

A ZnS homoepitaxial single crystal as shown in FIG. 1 was grown by a molecular beam epitaxy method on a ZnS substrate {(100), (110), (111)} produced from a ZnS bulk single crystal containing iodine in the range of 10-1000 ppm and obtained by using iodine as transport medium. It was compared with ZnS single crystals heteroepitaxially grown on a conventional substrate by GaAs (dislocation density $= 10^5$ cm$^{-2}$) or Si (dislocation density $= 10^7$ cm$^{-2}$) and found that photoluminescence from deep levels was extremely weak. This indicates that a high-quality epitaxial single crystal thin film of ZnS with dislocation density of $2 \times 10^4$ cm$^{-2}$ has been obtained. In FIG. 1, numeral 1 indicates a ZnS substrate single crystal formed by an iodine transport method so as to contain 100 ppm of iodine. Numeral 2 indicates an epitaxially grown ZnS single crystal by a molecular beam epitaxy method with the substrate temperature of 300° C., Zn beam intensity of $1.3 \times 10^{-4}$ Pa, S beam density of $6.6 \times 10^{-4}$ Pa in a vacuum environment of $1.3 \times 10^{-7}$ Pa at the growth time. FIG. 2 shows photoluminescence spectra of a single crystalline ZnS growth by a method of the present invention and a ZnS crystal grown on a GaAs substrate by a prior art method. As shown by Curve (1) therein, the crystal obtained by a method of the present invention emits only 3.79 eV photons extremely near the band gap (free exciter emission) and there is hardly any emission on the lower energy side from deep levels. As shown by Curve (2), the ZnS crystal grown for comparison on GaAs by a prior art method shows no emission in the neighborhood of the band gap. There is only a broad emission peak at 2.70 eV from deep levels.

EXAMPLE NO. 2

Homoepitaxial single crystals of ZnSe were grown by an organic metal chemical vapor deposition method on ZnSe substrates having different surface directions produced from bulk single crystals of ZnSe grown by a halogen transport method. According to evaluations by photoluminescence, no light emission was observed at all from deep levels and light emission from the band edge was also weak under weakly excited conditions, indicating again that a high-resistance, high-purity crystal has been obtained. When the photoluminescence excitation intensity was increased, observed light emission was significant only at the band gap energy (wavelength).

An n-type conductive layer could be grown controllably within a resistivity range of 10-10$^{-3}$ cm by adding Al during the growth process by the aforementioned metalorganic chemical vapor deposition method. The surface flatness of these crystals was excellent and it could be concluded by reflection high-energy electron diffraction (RHEED) that they were high-quality single crystalline films. FIGS. 3A and 3B show RHEED patterns of crystals grown according to the present invention and by a prior art method, respectively. FIG. 3A clearly shows a diffraction pattern having much higher orientation (single crystalline) characteristics than that shown in FIG. 3B.

EXAMPLE NO. 3

Single crystals were grown by the epitaxial atomic layer growth method whereby single atomic layers of ZnS were piled up by controllingly opening and closing a shutter above a crucible containing the material within a high vacuum using a molecular beam epitaxy growth apparatus. Homoepitaxial atomic layer growth films of ZnS could be obtained on (111)Zn and (111)S substrates by appropriately controlling and setting the substrate temperature. They were high-quality single crystal films with excellent surface flatness with low concentration of impurities and their thickness was well controlled. Such single crystals could not be obtained controllably by any similar method on substrates of different types such as GaAs.

The foregoing description of the present invention has been presented for purposes of illustration and description. It is not intended to be exhaustive or to limit the invention to the precise form disclosed, and many modifications and variations are possible in light of the above teaching. For example, what can be grown on a substrate produced by a method embodying the present invention is not limited to single crystals. Polycrystals, microcrystals and non-crystals may also be grown. In summary, the present invention teaches the use of a substrate of ZnS, ZnSe, ZnTe and the like for unepitaxial growth produced from a bulk single crystal obtained by a halogen transport method to epitaxially grow a single crystal of a II-VI semiconducting compound with high-purity and few defects, thereby establishing a basic technology of growing high-quality epitaxial single crystals which are necessary for the conductive control of a II-VI semiconducting compound. Compared to the conventional method of growth by using a III-V compound or an elemental semiconductor of Group IV as a substrate, the present invention clearly presents a new basic technology of high-purity growth of II-VI semiconducting compounds such as ZnS, ZnSe and ZnTe as well as their compound solid solution crystals and superlattice crystals.

What is claimed is:

1. A method of expitaxially growing a single crystal film of a II-VI semiconducting compound on a substrate characterized in that a single crystal of a II-VI semiconducting compound grown by a chemical transport method with a halogen as the transport medium is used as said substrate wherein the halogen is selected from the group consisting of chlorine, bromine and fluorine and the substrate is subjected to a heat treatment so as to reduce halogen density inside the substrate.

2. A method of epitaxially growing a single crystal film of a II-VI semiconducting compound on a substrate characterized in that a single crystal of a II-VI semiconducting compound is grown by a chemical transport method with iodine as the transport medium being used as the substrate, wherein the substrate contains iodine in an amount in the range of from 10–1000 ppm.

3. A method of claim 2 wherein said substrate contains iodine in the range of 10–1000 ppm.

4. A method of claim 2 wherein said substrate is a ZnS substrate made from a ZnS bulk single crystal.

* * * * *